(12) United States Patent
Shigetomi et al.

(10) Patent No.: US 7,049,553 B2
(45) Date of Patent: May 23, 2006

(54) SUBSTRATE PROCESSING APPARATUS AND SUBSTRATE PROCESSING METHOD

(75) Inventors: Kenichi Shigetomi, Koshi-Machi (JP); Nobuyuki Sata, Koshi-Machi (JP); Toshichika Takei, Kikuyo-Machi (JP); Masatoshi Kaneda, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/867,744

(22) Filed: Jun. 16, 2004

(65) Prior Publication Data

US 2004/0250762 A1 Dec. 16, 2004

(30) Foreign Application Priority Data

Jun. 16, 2003 (JP) ............................. 2003-171263
Apr. 30, 2004 (JP) ............................. 2004-136555

(51) Int. Cl.
*H05B 1/02* (2006.01)
(52) U.S. Cl. ...................... 219/482; 219/497; 392/418; 118/724
(58) Field of Classification Search ................ 219/482, 219/486, 497; 392/416, 418; 118/724, 725; 156/345.27
See application file for complete search history.

(56) References Cited

U.S. PATENT DOCUMENTS

| 5,225,663 | A | * | 7/1993 | Matsumura et al. | ......... | 219/543 |
| 5,567,267 | A | * | 10/1996 | Kazama et al. | ......... | 156/345.27 |
| 6,222,161 | B1 | | 4/2001 | Shirakawa et al. | | |
| 6,402,509 | B1 | | 6/2002 | Ookura et al. | | |

FOREIGN PATENT DOCUMENTS

JP 11-74187 3/1999

* cited by examiner

*Primary Examiner*—Mark Paschall
(74) *Attorney, Agent, or Firm*—Oblon, Spivak, McClelland, Maier & Neustadt, P.C.

(57) ABSTRACT

Immediately after a cold substrate G is placed on a substrate table 3, a large electric power P1 is supplied to a heating element 32 embedded in the substrate table for a time period T1 so that temperature of the substrate table overshoots a target temperature, and thereafter zero or very small electric power P2 is supplied to the heating element for a time period T2 so that the temperature of the substrate table 3 is lowered to the target temperature while temperature of the substrate continues to rise up to the target temperature. When both the temperature of the substrate table and of the substrate reaches approximately to the target temperature after the time period T2 has elapsed, control of the electric power is entrusted to a PID controller.

23 Claims, 12 Drawing Sheets

SUBSTRATE PROCESSING APPARATUS AND SUBSTRATE PROCESSING METHOD

BACKGROUND OF THE INVENTION

1. Field of the Invention

The present invention relates to an apparatus and a method for performing a heat treatment of a substrate, for example, a baking treatment of a mask substrate for a photomask after it is coated with a resist solution, or after it is exposed and before it is developed.

2. Description of the Related Art

In a semiconductor device fabricating process, a technique called photolithography is employed to form a resist pattern on a surface of a substrate for the semiconductor device. The photolithography technique is also employed for making a rectangular mask (reticle) used for an exposing step in the semiconductor device fabricating process. In making the mask, a substrate for the mask is coated with a resist solution to form a resist film on the substrate, the resist film is exposed to provide the resist film with a predetermined pattern, and the resist film is developed.

The resist solution comprises chemical components of the resist film dissolved in a solvent. After the substrate is coated with the resist solution, the substrate is subjected to a heat treatment called "baking," thereby the solvent contained in the resist solution is vaporized to be removed. The baked substrate is subjected to a cooling treatment by which the temperature of the substrate is lowered to a predetermined temperature before exposure of the substrate. The heat treatment or the cooling treatment is carried out by placing a substrate on a table or a plate provided therein with a heating or cooling means.

FIG. 12 shows a conventional heat treatment apparatus. Reference numeral 1 designates a hot plate on which a substrate G is placed. Four projections 11 are arranged on an upper surface of the hot plate 1. The substrate G is supported by the projections 11 while the back surface of the substrate G is vertically spaced at a slight distance such as 0.5 millimeters from the upper surface of the hot plate 1.

A heating element 12 is arranged in the hot plate 1. The electric power supplied to the heater 12 is controlled by a PID (proportional integral differential) controller 14 based on a detection signal of a temperature sensor 13 such as a thermocouple, so that the temperature of the substrate G is heated at a predetermined target temperature such as 130° C. In order to treat plural substrates while achieving high throughput, the hot plate 1 is heated at 130° C. beforehand, and then the substrate G is placed on the hot plate 1. After the substrate has been heated for a predetermined time at the target temperature, the substrate is removed from the heat plate and the next substrate is placed on the hot plate 1. In this way, plural substrates are heat-treated one by one.

The temperature of the substrate G before it is placed on the hot plate 1 is about 23° C., for example, and thus a large temperature difference exists between the substrate G and the hot plate 1. Accordingly, when such a cold substrate G is placed on the hot plate 1, a considerably large amount of heat is transferred from the hot plate 1 to the substrate G, and the temperature of the hot plate 1 is thus considerably lowered.

If high PID control gains are set in the PID controller 14, the temperature of the hot plate 1 rapidly rises up to the original temperature, or the target temperature. However, in this case, the temperature of the hot plate 1 overshoots the target temperature and oscillates with high amplitude, and resultantly, the substrate temperature overshoots the target temperature. This causes undesirable variation in the thickness of the film (e.g., resist film) over the substrate surface.

In order to avoid such disadvantage, with the conventional heat treatment apparatus, the PID control gains are set low to raise the temperature of hot plate 1 slowly, as shown in FIG. 13, in order to prevent overshooting of the temperature of the hot plate 1. However, in this case, a considerably long time (TA) is required to return the temperature of the hot plate 1 back to the target temperature.

JP11-74187A discloses a heat treatment apparatus designed for solving the aforementioned problem. In the heat treatment apparatus, the temperature controller has two operation modes, one being a PID control mode in which the temperature is controlled by a PID controller, the other being a fixed power supply mode in which a large fixed electric power is supplied to a heating element.

Immediately after the cold substrate is placed on the hot plate, a fixed, large electric power (full power) is supplied to the heating element for a predetermined time by using a timer in order to rapidly replenish an amount of heat to be drawn from the hot plate by the substrate. The fixed electric power and the predetermined time period are determined so that the temperature of the hot plate overshoots the target temperature when the predetermined time has elapsed. When the predetermined time has elapsed, the supply of the fixed large electric power is stopped, and the operation mode is switched from the fixed power supply mode to the PID control mode.

However, the technique disclosed in JP11-74187A has the following problem. That is, the temperature of the hot plate continues to rise for a while, even after the supply of the large fixed electric power is stopped, in fact. Accordingly, the actual temperature of the hot plate changes independently of a manipulation amount calculated by the PID controller and thus stable PID control is impossible, and this condition continues for a while. Accordingly, a considerably long time is required for the temperature of the hot plate and the substrate to be stable at the target temperature.

SUMMARY OF THE INVENTION

The present invention has been made in view of the foregoing problems. It is therefore the object of the present invention to provide an apparatus and a method capable of rapidly raising temperature of the substrate up to a target temperature, and of making the substrate temperature stable at the target temperature in a short time period. Another object of the present invention is to provide an apparatus and a method that achieves high in-plane temperature uniformity over the substrate surface during temperature rising stage, even if the substrate is heated by plural heating elements.

In order to achieve the objectives, the present invention provides a substrate processing apparatus, which includes: a substrate table having a heater and adapted to support a substrate to be heat treated on or above the substrate table; a thermometer adapted to measure temperature of the substrate table; and a temperature controller having first and second command generators each configured to generate a power command specifying electric power to be supplied to the heater, wherein: the first command generator is configured to generate a power command specifying electric power to be supplied to the heater during a first time stage in which temperature of the substrate rises approximately to a target temperature of the substrate; the first command generator is configured to generate a first power command specifying electric power to be supplied to the heater during a first time period of a first time stage, and a second power command specifying electric power to be supplied to the heater during a second time period of the first time stage following the first time period of the first time stage, according to a power pattern determined beforehand to define change in electric power to be supplied to the heater during the first time stage; the electric power specified by the second power command is smaller than that specified by the first power command; and the second command generator is configured to generate a third power command specifying electric power to be supplied to the heater and determined based on a deviation of the temperature measured by the thermometer from a target temperature of the substrate table in order to make the temperature of the substrate table coincide with the target temperature of the substrate table, during a second time stage following the second time period of the first time stage.

The present invention also provides a substrate processing apparatus, which includes: a substrate table having a heater and adapted to support a substrate to be heat treated on or above the substrate table; a thermometer adapted to measure temperature of the substrate table; and a temperature controller having a first command generator and a second command generator, the first command generator being configured to generate a first power command specifying electric power to be supplied to the heater during a first time stage, the second command generator being configured to generate a second power command specifying electric power to be supplied to the heater and determined based on a deviation of the temperature measured by the thermometer from a target temperature of the substrate table in order to make the temperature of the substrate table coincide with the target temperature of the substrate table, during a second time stage following the first time stage, wherein: the second command generator has a calculator configured to calculate the electric power corresponding to the second power command; the calculator is also configured to calculate or store, during the first time stage, a value necessary for the calculator to calculate the electric power corresponding to the second power command at a beginning of the second time stage; and the temperature controller has an activator configured to activate the calculator before the first time stage has completed.

The present invention also provides a substrate processing apparatus, which includes: a substrate table having a heater and adapted to support a substrate to be heat treated on or above the substrate table; a thermometer adapted to measure temperature of the substrate table; and a temperature controller having a first command generator and a second command generator, the first command generator being configured to generate a first power command specifying electric power to be supplied to the heater during a first time stage, the second command generator being configured to generate a second power command specifying electric power to be supplied to the heater and determined based on a deviation of the temperature measured by the thermometer from a target temperature of the substrate table in order to make the temperature of the substrate table coincide with the target temperature of the substrate table, during a second time stage following the first time stage, wherein: the second command generator has a calculator configured to calculate the electric power corresponding to the second power command; the calculator has a memory that stores a value, which is determined beforehand and is necessary for the calculator to calculate the electric power corresponding to the third power command at a beginning of the second time stage.

According to another aspect of the present invention, a substrate processing method is provided, the method includ-ing the steps of: placing a substrate on or above a substrate table having a heater; supplying a first electric power, which is determined beforehand, to the heater for a first time period, and thereafter supplying a second electric power, which is determined beforehand and is smaller than the first electric power, to the heater for a second time period, thereby raising temperature of the substrate table to overshoot a target temperature of the substrate table and thereafter lowering the temperature of the substrate table approximately to the target temperature of the substrate, and thereby raising temperature of the substrate approximately to a target temperature of the substrate; supplying, after supplying the second electric power to the heater for the second time period, a third electric power to the heating element for a third time period, while measuring temperature of the substrate table and while controlling the third electric power based on a deviation of the measured temperature of the substrate table from the target temperature of the substrate table in order to make the measured temperature of the substrate table coincide with the target temperature of the substrate table.

Further features of the present invention will become apparent in view of the following description of the preferred embodiments and the attached drawings.

DESCRIPTION OF THE PREFERRED EMBODIMENTS

Figure 1:
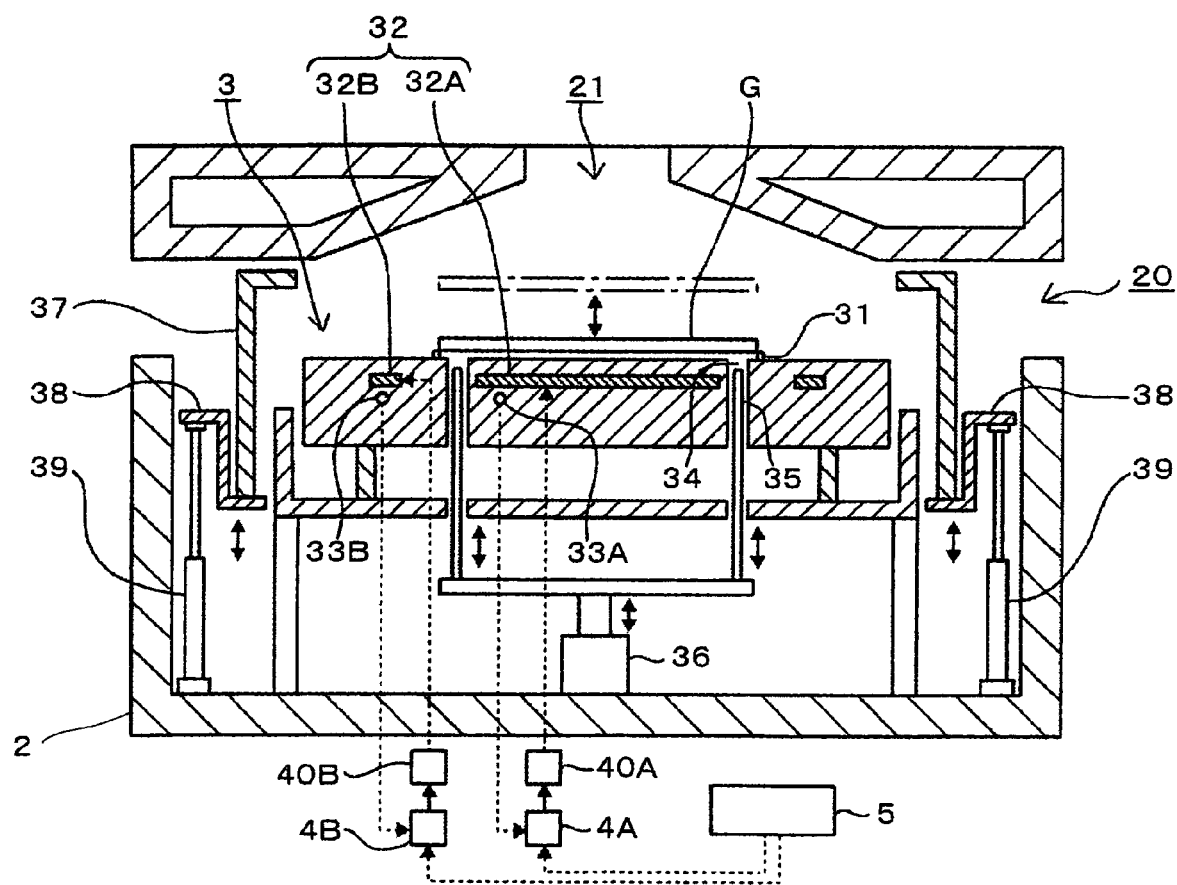
FIG. 1 is a vertical cross-sectional view of the substrate processing apparatus in a first embodiment of present invention.

A preferred embodiment of a substrate processing apparatus (in detail, a baking apparatus, or heat treatment apparatus) according to the present invention will be described, with reference to FIGS. 1 and 2. A processing vessel 2, which is an enclosure of the substrate processing apparatus, has a side wall provided with a circumferential opening 20, through which a substrate transfer arm (not shown) can access the interior of the processing vessel 21. An exhaust port 21 is formed at the central area of a ceiling of the processing vessel 2. The atmosphere in the processing vessel 2 can be discharged through the exhaust port 21 by an exhaust system (not shown) connected thereto.

Arranged in the processing vessel 21 is a substrate table 3 on which a substrate G to be heat-treated is placed in a predetermined substrate placement area. The substrate table 3 is provided with plural projections 31 (so-called "proximity pins"), through which the substrate G is supported by the substrate table 3 while the substrate G is spaced from the upper surface of the substrate table 3 at about 0.2 millimeters, for example.

A heater 32 including at least one heating element, each of which is typically an electric resistance heating wire, is arranged in the substrate table 3 to generate heat for heating the substrate G. In the illustrated embodiment, the heater 3 includes a first, rectangular heating element 32A opposing the central area of the substrate G placed on the table 3, and a second, ring-shaped heating element 32B opposing the peripheral area of the substrate G placed on the table 3. The heating elements 32A and 32B are electrically separated from each other. The substrate table 3 is structured as a "hot plate" heated by the heating elements 32A and 32B. The substrate G is heated by heat transferred through the projections 31 and by radiant heat emitted from the surface of the table 3.

Temperature sensors 33A and 33B, each of which is typically a thermocouple, are embedded in the substrate table 3 to measure temperature of a first, central area of the table 3 heated by the first heating element 32A and temperature of a second, peripheral area of the table 3 heated by the second heating element 32B, respectively.

Four through holes 34 extend through the substrate table 3. Substrate support pins 35 for supporting the back surface of the substrate G are inserted in the holes 34. In detail, the support pins 35 support the oblique face (not shown) of the back surface of the substrate. The support pins 35 are connected to an elevation mechanism 36, thereby the tip portion of each support pins 35 can protrude from and retract into the substrate table 3.

The substrate G carried into the interior of the processing vessel 2 through the opening 21 while being held horizontally by the not-shown substrate transfer arm is placed on the projections 31, or above the substrate table 3, by cooperation of the substrate transfer arm and the support pins 35. In an alternative embodiment, a substrate table which supports the substrate directly on its upper surface without using proximity pins may be used.

A cylindrical shutter 37 is arranged in the processing vessel 2 to surround the side circumference of the substrate table 3. The upper portion of the shutter 37 is bent inward. The shutter 37 is connected to an elevation mechanism 39 such as an air cylinder through a support member 38. The shutter 37 rises to a vertical position thereof where a small gap is formed between the upper end face of the shutter 37 and an inner surface of the processing vessel 2 opposing thereto, in order to almost close the opening 21 to form a processing space surrounding the substrate G placed on the substrate table 3.

The first and second heating elements 32A and 32B are respectively connected to power sources 40A and 40B, which are respectively connected to temperature controllers 4A and 4B, as shown in FIG. 1. In a typical embodiment, the power source 40A (40B) is provided with a PWM (pulse width modulation) control circuit, which controls electric power supplied to the heating element 32A (32B) according to a power command (described later) received from the temperature controller 4A (4B). Alternatively, the power source 40A (40B) may be provided with an analogue control circuit capable of continuously changing electric power supplied to the heating element 32A (32B) according to the power command. It should be noted that, if the PWM control is employed, the electric power supplied to the heating element means an average electric power (which is proportional to duty ratio) supplied to the heating element during one switching cycle of a switching element of the PWM control circuit, in this specification.

The temperature controller 4A will be described in detail with reference to FIG. 3. The temperature controller 4B has the same structure and function as those of the temperature controller 4A, and thus the description thereof will be omitted. The temperature controller 4A includes a first command generator 42 for a "pattern control" described later, and a second command generator 41 for a conventional PID control. The second command generator 41 includes a subtractor 411 and a PID calculator 412. The subtractor 411 calculates a deviation (i.e., an error) of the temperature measured by the temperature sensor 33A (i.e., a thermometer) from the target temperature. The PID calculator 412 determines electric power to be supplied from the power source 40A to the heating element 32A that enables the temperature measured by the temperature sensor 33A to coincide with the target temperature, and outputs the determined value of the electric power as a power command to the power source 40A.

The first command generator 42 includes a data storage 43, in which a power pattern P defining change in electric power to be supplied to the heating element 32A with time is stored. The first command generator 42 has an output unit 421, which outputs power commands according to the power pattern P. In the illustrated embodiment, the first command generator 42 outputs a first power command (P1) instructing the power source 40A to supply a first, fixed electric power of P1 (P1 is the full power of the power source 40A, or the maximum allowable input of the heating element 32A) to the heating element 32A during time period T1 (e.g., 3 minutes), and outputs a second power command (P2) instructing the power source 40A to supply a second, fixed electric power of P2 (P2 is zero) to the heating element 32A during time period T2 (e.g., 1 minute) following the time period T1, according to the power pattern P shown in FIGS. 3 and 4A. The first command generator 42 has a timer for time management (time periods T1 and T2).

Preferably, different power patterns are assigned to the heating elements 32A and 32B (i.e., temperature controllers 4A and 4B), respectively. For example, the first electric power P1 assigned to the heating element 32A for heating the central area of the substrate table 3 is preferably smaller than the first electric power P1 assigned to the heating element 32B for heating the peripheral area of the substrate table 3. Thereby, the heating elements 32A and 32B can provide calorific powers suitable for heating respective areas of the substrate table 3 in order to achieve in-plane temperature uniformity over the substrate surface during the substrate temperature rising stage, and thus achieve in-plane uniformity of the resultant resist-film thickness.

The first command generator 42 starts outputting the first power command (P1) when the distance between the substrate G and the substrate table 3 becomes less than a predetermined value. In the illustrated embodiment, the first command generator 42 starts outputting the first power command when the temperature controller 4A receives a signal representing that the substrate G is placed on the substrate table 3. The signal may be a detection signal which is generated when lowering of the substrate support pins 35 is detected, or a command signal that instructs the support pins 35 to be lowered.

The temperature controller 4A includes a switch 44 to select one of the command generators 41 and 42 providing the power command to the power source 40A. The temperature controller 4A further includes a contact 45, which closes when receiving a signal representing that the substrate G is placed on the substrate table 3 to activate the output unit 421 of the first command generator 42.

In a typical embodiment, the temperature controller 4A (and 4B) comprises a computer having electronic devices including a CPU and suitable memory means. The block diagram shown in FIG. 3 represents the functions achieved by the computer hardware and the computer program. However, the temperature controller 4A may be composed of plural electronic units or circuits each having one or more functions corresponding to one or more of the functional blocks of FIG. 3

The power pattern P will be described in detail. The first electric power P1 and the time period T1 are determined so that the supply of electric power P1 for the time period T1 allows the heating element 32A to generate an amount of heat approximately corresponding to an amount of heat which the cold substrate G draws from the substrate table 3, causing the temperature of the substrate table 3 to overshoot the target temperature of the substrate G.

The second time period T2 during which no electric power is supplied to the heating element 32A is provided for smooth transition from the pattern control mode to the PID control mode. The provision of the second time period T2 allows the temperature changing curves of the substrate G and the substrate table 3 to approach asymptotically to the target temperature (which is common to both the substrate G and the substrate table 3) while the absolute value of the gradient of the curves are gradually reduced. According to the above, the time integral of the deviation of the actual temperature of the substrate table 3 from the target temperature from a certain point of time during a second time period T2 to a point of time when the control mode is switched from the pattern control mode to the PID control mode (hereinafter referred to as "switching point of time") can be reduced, and the time differential of the deviation about the switching point of time can also be reduced, resulting in smooth transition from the pattern control mode to the PID control mode.

Figure 4A:
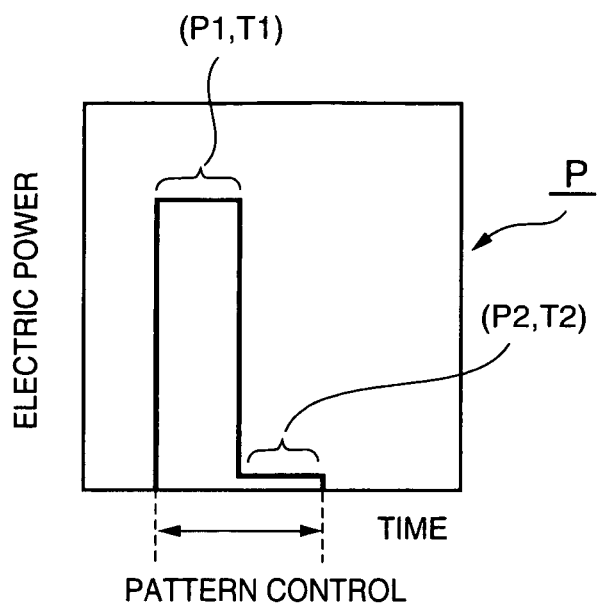
FIG. 4A is a graph showing a power pattern stored in a power pattern storage of a first command generator shown in FIG. 3.
Figure 4B:
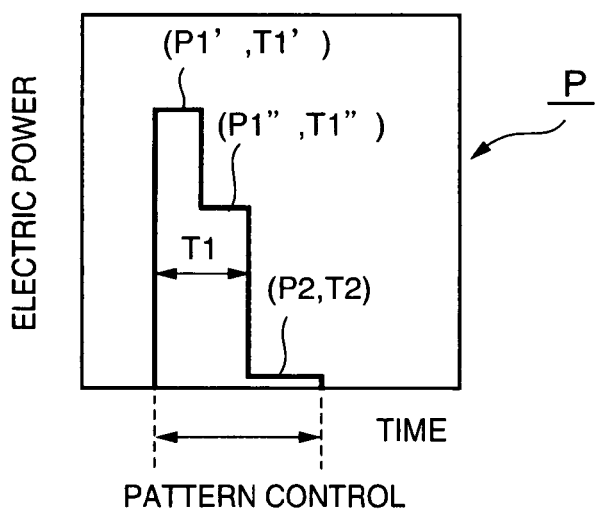
FIGS. 4B and 4C are graphs each showing an alternative power pattern.
Figure 4C:
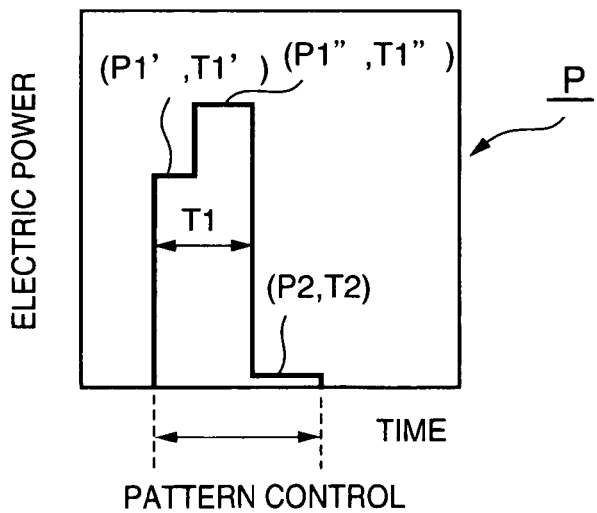

The power pattern P may be modified as long as it meets aforementioned technical concept. In the illustrated embodiment, the power pattern P is a two-stage stepwise pattern defining two different values of electric power P1 and P2 to be supplied to the heating element 32A during the first and second time periods T1 and T2, respectively, as shown in FIG. 4A, but is not limited thereto. The power pattern P may be such as shown in FIGS. 4B and 4C, in which the first time period T1 is divided into two (or more) time frames T1' and T1" to which different values P1' and P1" of the electric power to be supplied to the heating element 32A are assigned, respectively. In addition, the electric power P2 is not limited to zero, and may be a certain small value smaller than P1. Moreover, the second time period T2 may be divided into two (or more) time frames, and zero electric power is assigned to the first time frame and a small electric power is assigned to the second time frame. The power pattern P is preferably determined beforehand through an experiment and/or a simulation, more preferably through the experiment.

In the aforementioned embodiment, only one power pattern P is stored in the data storage 43 of the first power command generator 42. The data storage 43 may store plural power patterns for different target temperatures, and/or for different sorts of substrates G to be processed. In this case, the output unit 421 may read out one of the power patterns from the data storage 43 according to a command received from means for specifying a power pattern to be used, such as a superordinate computer configured to control all the operations of the substrate processing apparatus and connected to the temperature controller 4A (4B).

Storing and rewriting of the power pattern P in the power pattern storage 43 is carried out by a control-data setting means 5. The control-data setting means 5 may be a part of an apparatus controller or a superordinate computer configured to control all the operations of the substrate processing apparatus. Alternatively, a portable computer such as a notebook computer may be used as the control-data setting means 5, in order to facilitate the control-data setting process. In this case, an interface (not shown) is provided in the temperature controller 4A (4B).

The operation of the substrate processing apparatus will be described hereinafter. The PID calculator 412 is connected to the power source 40A (40B) to control electric power supplied to the heating element 32A (32B) according to the power command generated by the PID calculator 412. In other words, the temperature of the substrate table 3 is controlled in a PID control mode. Thus, temperature of the substrate table 3 is maintained at a target temperature of the substrate (e.g., 130° C.).

Then, the shutter 37 is lowered, and the substrate transfer arm (not shown) carries a substrate G coated with a resist solution into the processing vessel 2 through the opening 21. Upon cooperation of the substrate transfer arm and substrate support pins 35, the substrate G is transferred to the substrate support pins 35. The support pins 35 are lowered so that the substrate G is placed above the substrate table 3.

When the support pins 35 are lowered to and stop at their lowermost positions, the contact 45 is closed, the switch 44 is switched to connect the first command generator 42 to the power source 40A (and 40B), and the output unit 421 reads out the power pattern P in the power pattern storage 43 to output two power commands sequentially to the power source 40A (40B). The power source 40A (40B) supplies electric power P1 and P2 to the heating element 32A (32B) according to the power commands. Immediately after delivering the substrate G to the substrate table 3, the not-shown substrate transfer arm withdraws from the processing vessel 2, and the shutter 37 rises to form a processing space surrounding the substrate G placed on the substrate table 3.

After the first power command generator 42 has outputted the first power command (P1) for the first time period T1 and thereafter the second power command (P2) for the first time period T2, in other words, after a predetermined time period for the pattern control has elapsed, the switch 44 is switched to connect the PID calculator 41 to the power source 40A

(40B), thereby the control mode is changed from the pattern control mode to the PID control mode.

The PID calculator 41 calculates electric power to be supplied to the heating element 32A (32B) in a conventional manner, and outputs the calculation result as the power command to the power source 40A (40B). Thereby, the electric power supplied to the heating element 32A (32B) from the power source 40A (40B) is controlled so that the actual temperature of the substrate table 3 and thus the substrate G are maintained at the target temperature to bake the substrate G. After a predetermined time period for the baking process has elapsed, the substrate G is carried out from the processing vessel 2 in the reverse order from the carrying-in of the substrate G.

Figure 5:
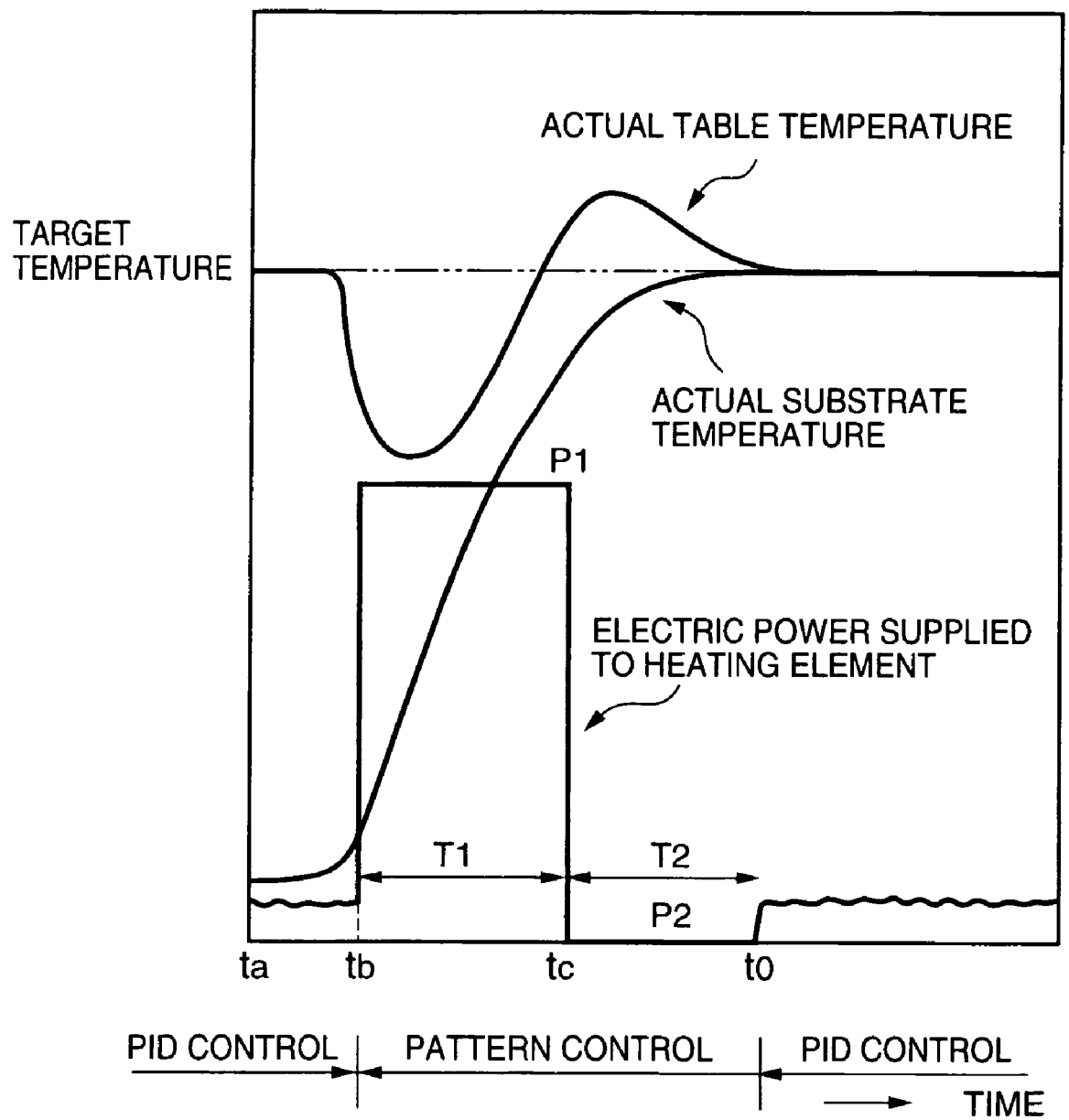
FIG. 5 is a graph showing change in actual temperature of the substrate and the substrate table, and change in electric power supplied to the heating element.

Change in actual temperature of the substrate table 3 and the substrate G will be described with reference to FIG. 5. Before the substrate is placed on the substrate table 3 ($t_a$–$t_b$), the temperature of the substrate table 3 is maintained at the target temperature (e.g., 130° C.) under the PID control. The temperature of the substrate G to be placed on the substrate table 3 is substantially equal to the atmospheric temperature of a clean room in which the substrate processing apparatus is installed. When the substrate G is placed on the substrate table 3 at a point of time $t_b$, the substrate G draws heat from the substrate table 3, and thus the temperature of the substrate G rises and the temperature of the substrate table 3 declines. At the point of time $t_0$, the temperature control mode is switched from the PID control mode to the pattern control mode, and thereafter, the heating elements 32A and 32B are supplied with the electric power P1 (which is equal to the full power of the power supply 5A and 5B), and the substrate table 3 is hardly heated.

Accordingly, the temperature curve of the substrate table 3 turns upward, and the temperature of the substrate table 3 overshoots the target temperature, 130° C. (i.e., the process or baking temperature of the substrate G). The substrate G has a certain heat capacity, and the temperature of the substrate G rises to follow the temperature rising of the substrate table 3 with a certain time delay. In a specific embodiment, the substrate is a glass substrate 6-millimeters thick, which has a considerably large heat capacity, and thus the time delay is long.

When the time period T1 has elapsed (at a point of time $t_c$), the electric power supplied to the heating elements 32A and 32B is reduced to P2, which is equal to zero in the illustrated embodiment. Accordingly, the temperature of the substrate table 3 starts to decreases after a short time has elapsed from the point of time $t_c$, but the temperature of the substrate G receiving the heat dissipated from the substrate table 3 continues to rise toward to the target temperature.

When the time periods T1 and T2 have elapsed (at a point of time to), the switch 44 is switched to connect the PID calculator 41 to the power source 40A (40B), and thus the control mode is changed back to the PID control mode. The power outputted from the power source 40A (40B) and thus the caloric power of the heating elements 32A and 32B are controlled so that the temperature measured by the thermometer 33 coincides with the target temperature. Thereby, the temperature of the substrate G is maintained at the target temperature to bake the substrate G.

According to the aforementioned embodiment, the temperature of the substrate G rises up to the target temperature and becomes stable at the target temperature in a short time period after the cold substrate G is placed on the substrate table 3.

The parameters defining the power pattern P are only P1, P2, T1 and T2. Thus, the power pattern P is readily modified by changing at least one of the parameters. Therefore, fine tuning of the power pattern for responding to individual characteristics of the apparatus (e.g., the difference in the air flow in the processing vessel) is readily carried out. In addition, in the substrate processing system in which plural substrate processing apparatuses are incorporated as the component units thereof, initial tuning of the power patterns of the plural units is readily carried out.

Figure 2:
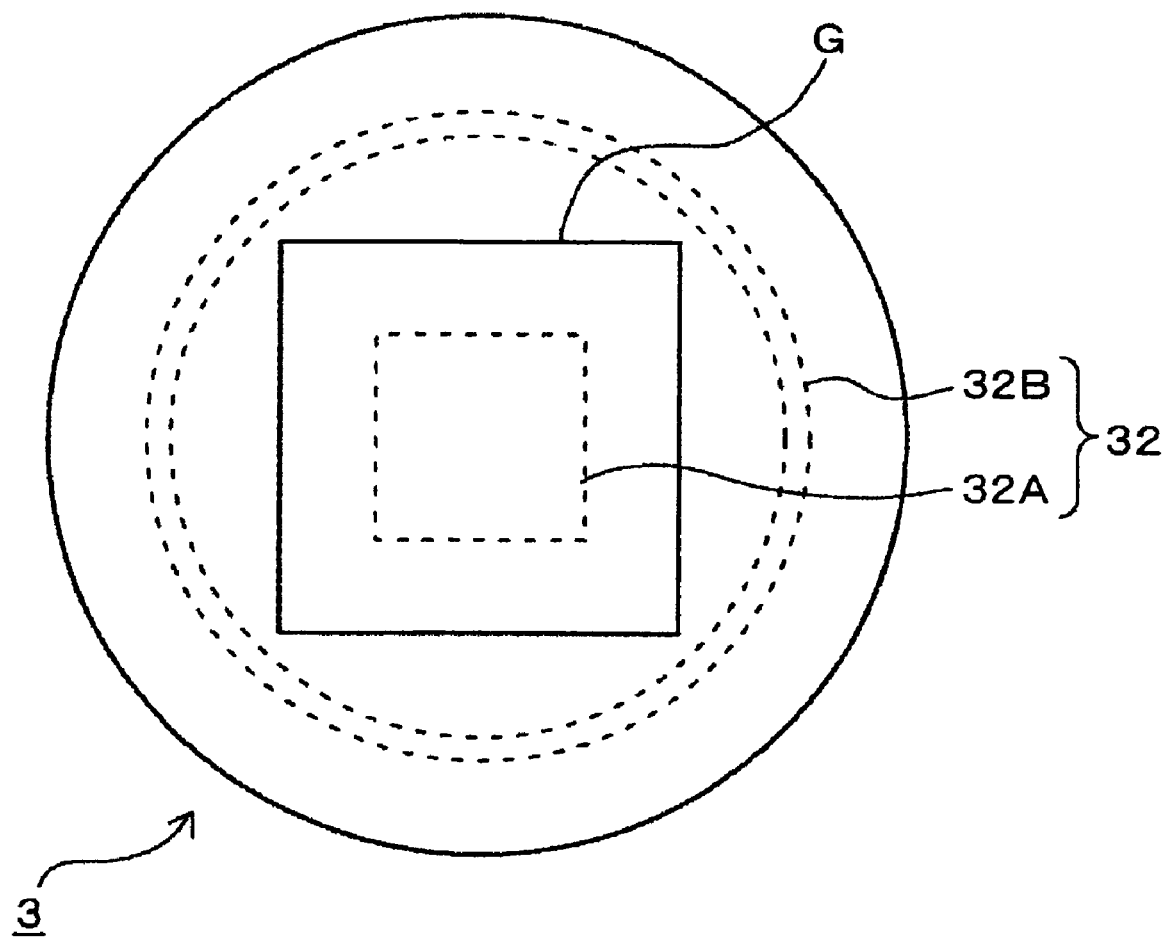
FIG. 2 is a top plan view of a substrate table of the substrate processing apparatus shown in FIG. 1, schematically showing an arrangement of heating elements.
Figure 6:
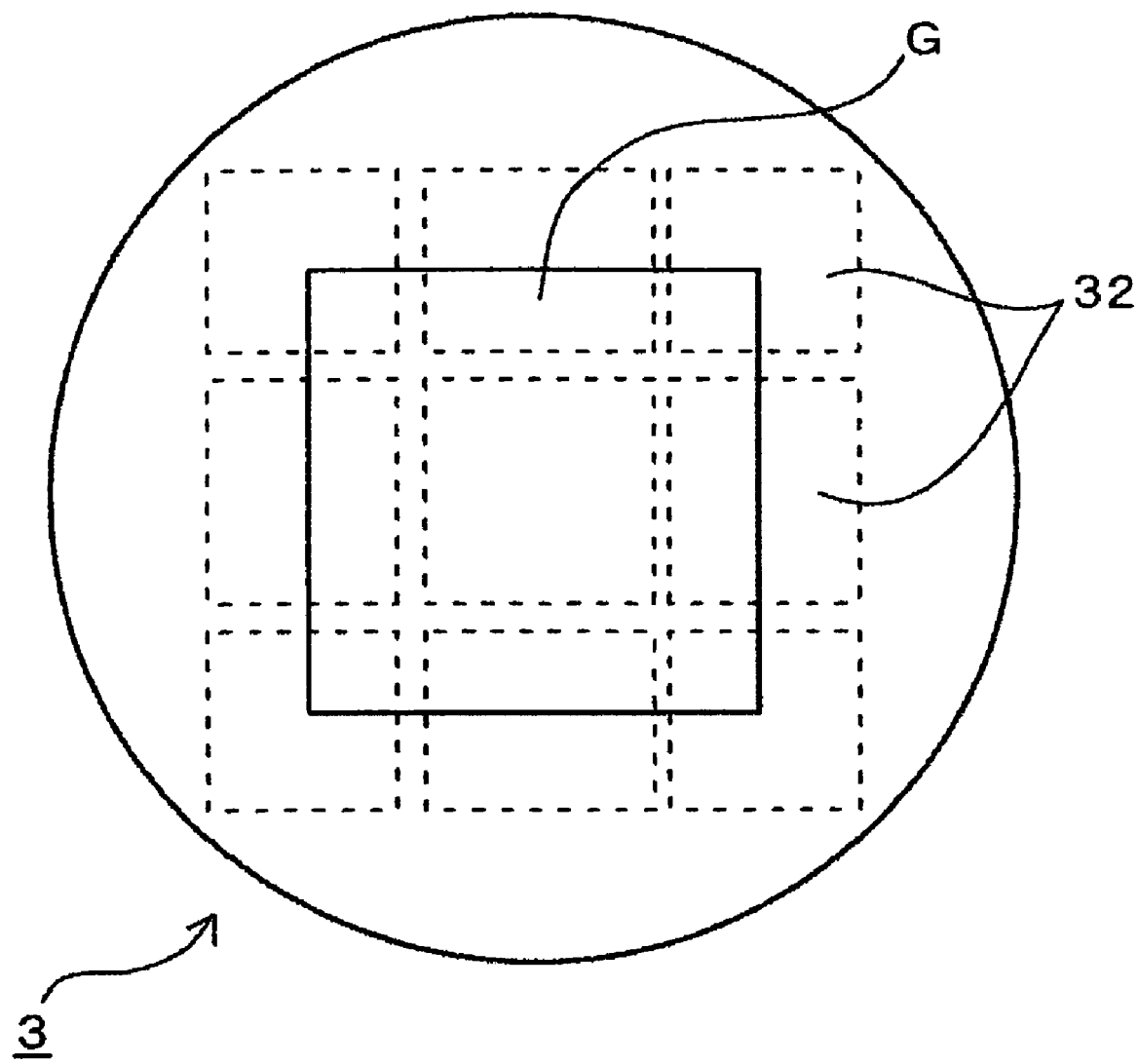
FIG. 6 is a top plan view of a substrate table showing an alternative arrangement of the heating elements.

The arrangement of the heating elements is not limited to as shown in FIG. 2. For example, the heater 32 may includes nine rectangular heating elements arranged in the substrate table 3 in a 3×3 matrix pattern, as shown in FIG. 6. In thus case, different power patterns may be assigned to different heating elements.

In the aforementioned embodiment, different power patterns P are assigned to the heating elements 32A and 32B, however the same power pattern may be assigned to the heating elements 32A and 32B.

The timing of switching the control mode from the PID control mode to the pattern control mode (the point of time $t_b$) is not limited to a point of time when the substrate G is placed on the substrate table 3. The switching may be conducted at a point of time before the substrate G is placed on the substrate table 3, such as a point of time when the not-shown substrate transfer arm holding the substrate G moves into the processing vessel or a point of time the substrate G held by the substrate transfer arm is located right above the substrate table 3. Namely, the switching timing may be determined based on the distance between the substrate G and the substrate table 3. Even if the switching is conducted before the substrate G is placed on the substrate table 3, essentially the same advantageous effect as that mentioned above can be achieved. However, too early switching may cause an adverse effect on the substrate G, and thus the switching timing must be determined through an experiment. It should also be noted that the switching may be conducted slightly after the substrate G is placed on the substrate table 3.

The heat treatment according to the present invention is not limited to a baking treatment by which the substrate G coated with a solution such as a resist solution is heated, and may be a heat treatment of a chemical amplification resist carried out after exposure and before developing, for example. Furthermore, the heat treatment may be a heating process by which an interlayer insulating film or an insulating film for protecting the semiconductor device is baked. The substrate G is not limited to the mask substrate G, and may be a semiconductor wafer or a glass substrate for a LCD (liquid crystal display).

The technical concept of the present invention is also applicable to a substrate cooling apparatus having a substrate table in which cooling means such as a peltiert element(s) is arranged to cool the substrate table. The electric power to be supplied to the peltiert element may be controlled such that a relatively large electric power is supplied at a first time period of a temperature lowering stage and a relatively small electric power is supplied at the second time period of the temperature lowering stage, and then the electric power is controlled in a PID control mode at the steady temperature stage following the temperature lowering stage.

Figure 7:
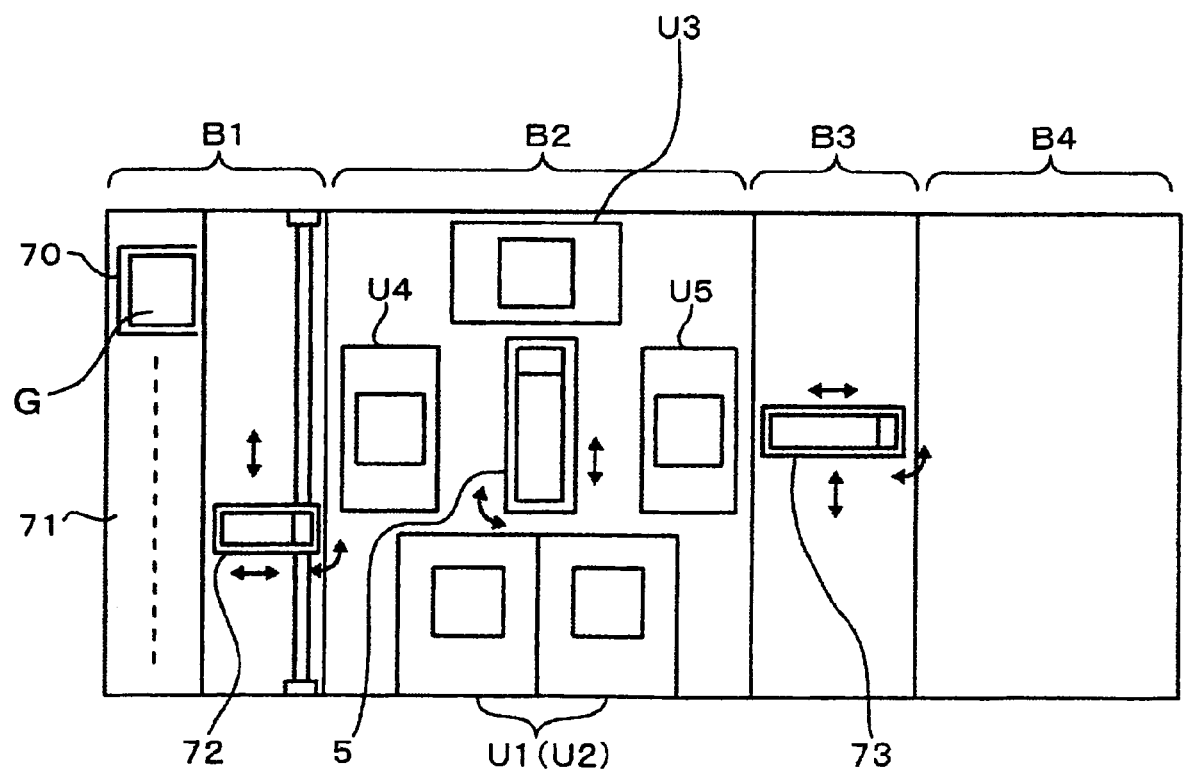
FIG. 7 is a top plan view of a coating-and-developing system in which the substrate processing apparatus shown in FIG. 1 is incorporated.
Figure 8:
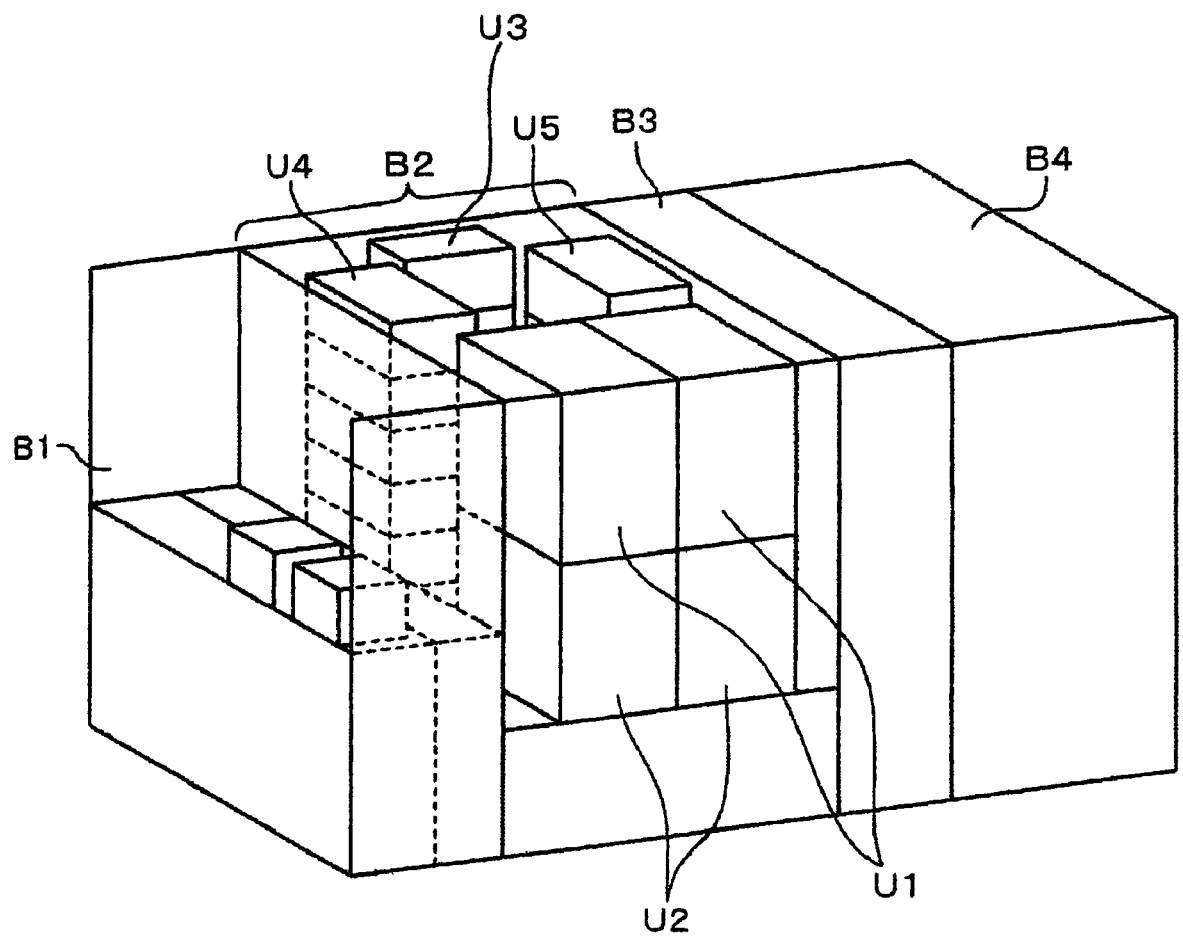
FIG. 8 is a perspective view of the coating-and-developing system shown in FIG. 7.

A coating-and-developing system, in which the heat treatment apparatus is incorporated as one component unit (called "heating unit" hereinafter), will be briefly described with reference to FIGS. 7 and 8. The system includes a carrier block B1. The carrier block B1 includes a carrier stage 71 and a substrate transfer member 72. A processing block B2 is connected to the carrier block B1 at the back side thereof.

A main substrate conveyer 5, which has been referred to as the "substrate transfer arm (not shown)" in the foregoing description, is arranged in the processing block B2. Arranged around the substrate conveyer 5 are a coating unit U1, a developing unit U2, a cleaning unit U3, and unit towers U4 and U5 each composed of heating units and/or cooling units piled-up vertically. As viewed from the carrier block B1, the coating unit U1 and the developing unit U2 are arranged on the right side, the cleaning unit U3 is arranged on the left side, the unit tower U4 is arranged on the near side, and the unit tower U5 is arranged on the far side.

The substrate transfer arm 5 is movable back and forth, is movable vertically, and is turnable about a vertical axis. The substrate transfer arm 5 can transfer the substrate G among the coating unit U1, the developing unit U2, the cleaning unit U3, and unit towers U4 and U5.

The processing block B2 is connected, through an interface block B3, to an exposing block B3, in which substrate G coated with a resist film is exposed by using a mask. A substrate transfer member 73 is arranged in the interface block B3, which carries the substrate G between a substrate relaying unit included in the unit tower U5 and the exposing block B4.

The operation of the coating-and-developing system will be briefly described. A substrate carrier 70 containing substrates G is carried into the carrier stage 71 by an external carrier conveyer. The substrate transfer member 72 takes out one substrate G from the carrier 70. The substrate G is transferred to the substrate transfer arm 5 through a substrate relaying unit included in the unit tower U4. The substrate transfer arm 5 carries the substrate G into the cleaning unit U3, a heating unit, a cooling unit, and the coating unit U1 in that order, by which a resist film is formed on the substrate G. Then, the substrate G is subjected to a pre-baking treatment in a heating unit, and is cooled to a predetermined temperature in a cooling unit. The substrate G is transferred via the substrate transfer member 73 into the exposing block B4, in which the substrate G is exposed.

Then, the substrate G is carried into a heating unit, in which the substrate G is subjected to a post-exposure-baking treatment. The substrate G is cooled to a predetermined temperature, and then is subjected to a developing treatment. The substrate G on which a resist mask having a predetermined mask pattern by the series of treatments mentioned above is returned to the original carrier 70.

Experiments

Experiments were Carried out in Order to Prove the Advantage of the Present Invention.

Experiment 1

Rectangular glass substrates G were heated by a baking apparatus shown in FIG. 1. In Experiment 1, change in temperature of the substrate G, temperature of the substrate table 3, and electric power supplied to the heating elements 32A and 32B, with time, were measured. The temperature of the substrate G was measured by a radiation thermometer arranged above the substrate G.

The experiment conditions are as follows:
Dimension of Substrate G: 152×152×6.35 (mm)
Initial Substrate Temperature: 23° C.
Target Temperature: 220° C.
Electric Power P1: 700 watts
Electric Power P2: 0 watt
Time Period T1 in which Electric Power P1 is supplied to the Heating Element 32A: 175 seconds
Time Period T2 in which Electric Power P2 is supplied to the Heating Element 32A: 45 seconds
Time Period T1 in which Electric Power P1 is supplied to the Heating Element 32B: 0 seconds
Time Period T2 in which Electric Power P2 is supplied to the Heating Element 32B: 220 seconds Note: No electric power was supplied to the heating element 32A after the time period T2. No electric power was supplied to the heating element 32B during the time periods T1 and T2. In other words, the heating element 32A was used exclusively for the pattern control, and the heating element 32B was used exclusively for the PID control. In this case, the structure of the temperature controlling means (temperature controllers 4A and 4B), which was used in Experiment 1, is somewhat modified based on the structure shown in FIG. 3. That is, the temperature controller 4A for the heating element 32A includes only the first command generator 42 configured to activate only during the first and second time periods T1 and T2 for the pattern control, and the temperature controller 4B for the heating element 32B includes only the second command generator 41 configured to activate only during time period(s) other than the first and second time periods T1 and T2 for the PID control. It should be noted that the heater (32) may include at least one first heating element (32A) to be used exclusively for the pattern control and at least one second heating element (32B) to be used exclusively for the PID control, and that this configuration is within a scope of the present invention.

Experiment 2

Figure 3:
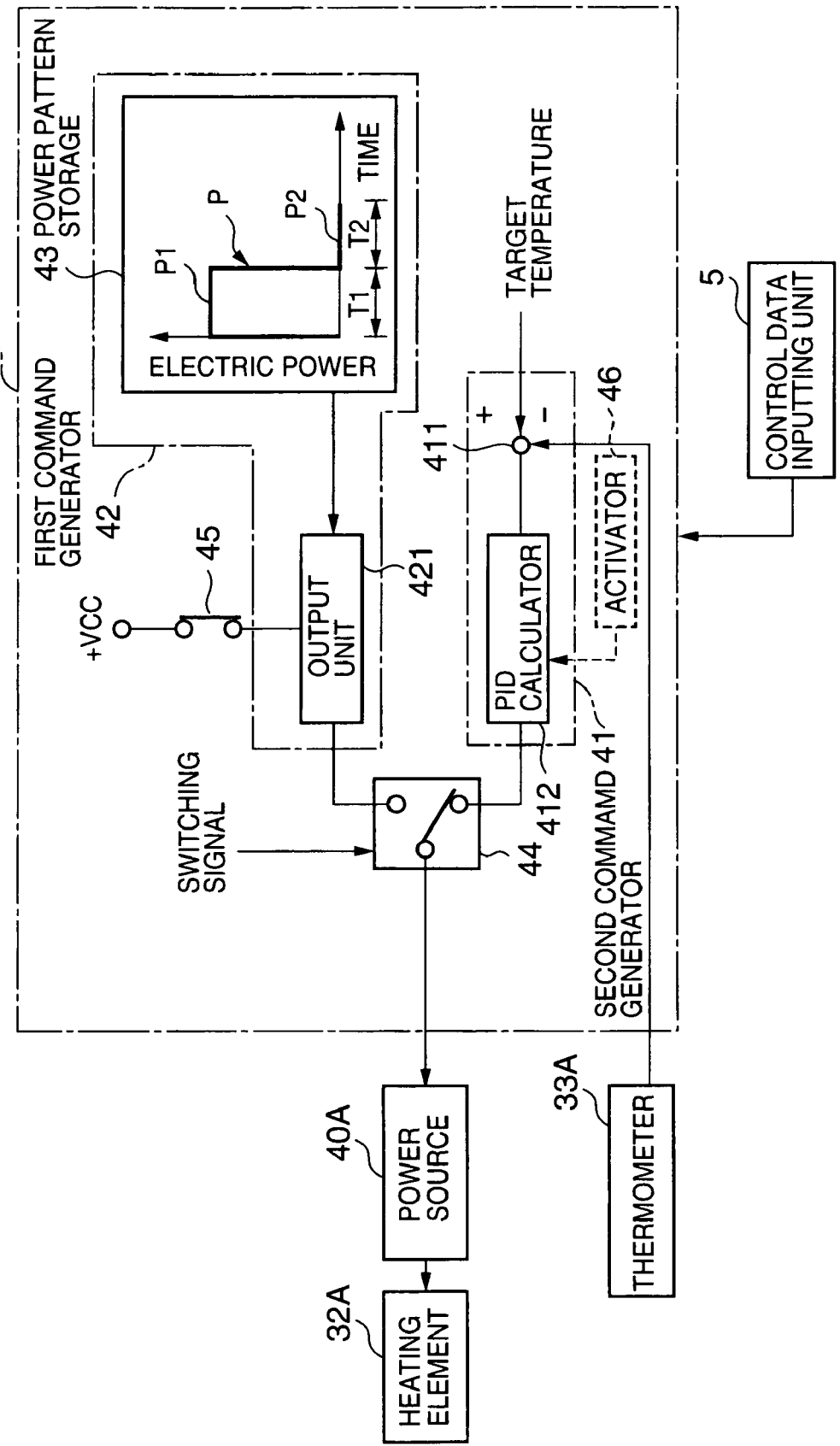
FIG. 3 is a block diagram schematically showing a temperature control system of the substrate processing apparatus shown in FIG. 1.

In Experiment 2, rectangular glass substrates G were heated by a baking apparatus having the same structure as that shown in FIGS. 1 and 3.

The conditions were as follows:
Dimension of Substrate G: 152×152×6.35 (mm)
Initial Substrate Temperature: 23° C.
Target Temperature: 220° C.
Electric Power P1: 700 watts
Electric Power P2: 0 watt
Time Period T1 in which Electric Power P1 is supplied to the Heating Elements 32A and 32B: 120 seconds
Time Period T2 in which Electric Power P2 is supplied to the Heating Elements 32A and 32B: 40 seconds Note: The same power pattern P is used for both the heating elements 32A and 32B for the pattern control during the time periods T1 and T2. After the time period T2, electric power supplied to each heating element (32A and 32B) is controlled by the second command generator 41 of each temperature controller (4A and 4B), in a PID control mode.

Figure 9B:
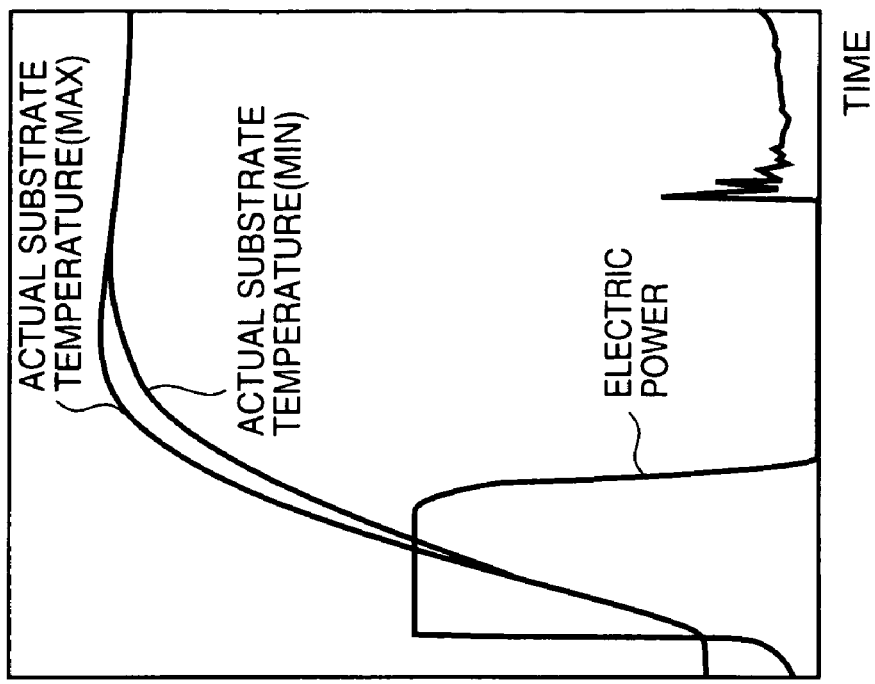
FIGS. 9A and 9B are graphs showing results of first and second Experiments, respectively.
Figure 9A:
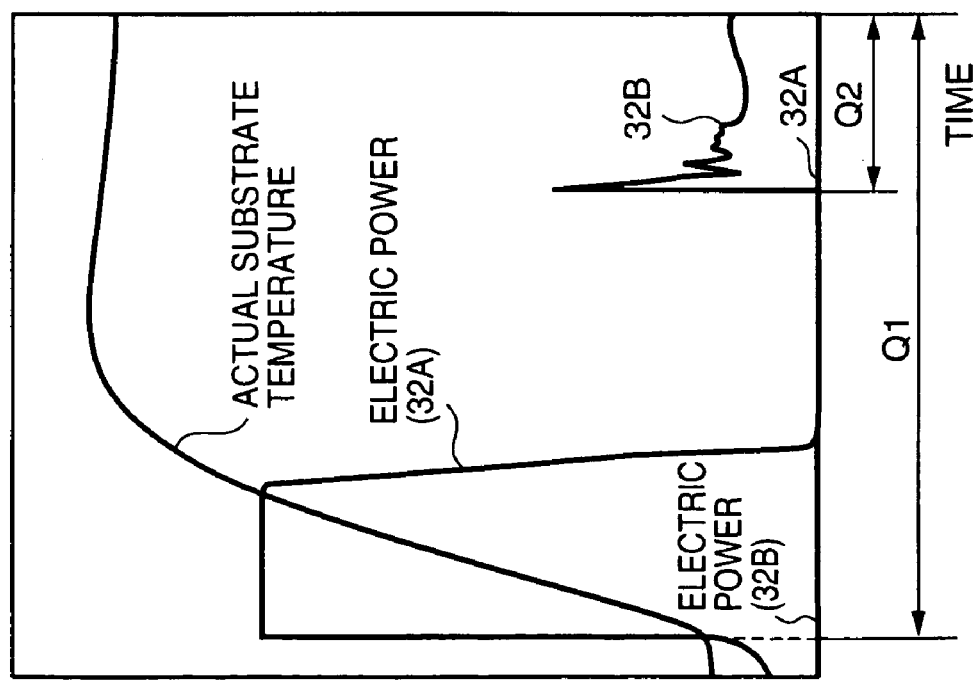

The results of Experiments 1 and 2 are shown in FIGS. 9A and 9B, respectively. In Experiment 1, the time period Q1 from the point of time when the substrate G is placed on the substrate table 3 to the point of time when the substrate temperature becomes stable at the target temperature was 260 seconds. In addition, after the control mode is switched from the pattern control mode to the PID control mode, the oscillation of the electric power supplied to the heating element was reduced in a very short time (about 20 seconds). A Comparative Experiment was also conducted, in which heating of the substrate table 3 was controlled only in the PID control mode. In the Comparative Experiment, the time period from the point of time when the substrate is placed on the substrate table to the point of time when the substrate temperature becomes stable at the target temperature was 340 seconds.

In Experiment 2, wide temperature distribution over the substrate surface existed during the temperature rising stage, and the maximum temperature difference in the substrate surface was 8° C. (see FIG. 9B). On the contrary, in Experiment 1, very narrow temperature distribution existed during the temperature rising stage.

In view of the above, it is concluded that the heating method, which starts the pattern control when the substrate G is placed on the substrate table 3 and thereafter switches to the PID control, achieves that the substrate temperature rises to the target temperature and becomes stable in a short time. It is also concluded that high in-plane temperature uniformity over the substrate surface is achieved by raising the temperature of the substrate G using the heating element 32A arranged in the central area of the substrate table 3 under the pattern control, and by thereafter maintaining the temperature of the substrate G by using the heating element 32B arranged in the peripheral area of the substrate table 3 under the PID control.

The second embodiment of the present invention will be described. The second embodiment is characterized in that a PID calculation is performed before switching from the pattern control mode to the PID control mode.

In the second embodiment the temperature controller 4A further includes an activator 46 (indicated by chain lines in FIG. 1) configured to output a calculation command, which instructs the PID calculator 412 to start the PID calculation (i.e., pre-activation of the PID calculator 412), at a point of time $t_d$ before switching from the pattern control mode to the PID control mode.

The activator 46 may output a calculation command after a predetermined time period has elapsed from the point of time when the substrate G is placed on the substrate table 3 or when the support pins 35 are lowered. In this case, the activator 46 includes a timer (not shown), to which the switching signal inputted to the switch 44 is also inputted. Alternatively, the activator 46 may output a calculation command when the temperature measured by the thermometer 33A approaches the target temperature (e.g., at a point of time when the temperature deviation reaches about ±4% of the target temperature). In this case, the activator 46 comprises a comparator (not shown), to which the subtractor 411 is connected.

In general, the PID calculator 41 calculates a manipulation amount "y" according to the following expression:

$$y = Kp \cdot e + Ki \int e \, dt + Kd(de/dt) \quad (1)$$

where "e" is a temperature deviation (error), and "Kp", "Ki" and "Kd" are coefficients. Therefore, the PID calculator 412 is inherently provided with at least an integrator (i.e., an integral term calculating unit), a differentiator (i.e., a differential term calculating unit) and a memory.

In the second embodiment, the PID calculator 412 starts to calculate time integral of the deviation ($\int e \, dt$) by using the integrator thereof during a predetermined time period before a point of time (the switching point of time) when the control mode is switched from the pattern control mode to the PID control mode and stores the calculation result in the memory. The PID calculator 412 also stores the deviation (e) at a point of time immediately before the switching point of time in the memory. The data stored in the memory are used for calculating the manipulation amount (y) at the switching point of time and at points of time immediately after the switching point of time.

Figure 11A:
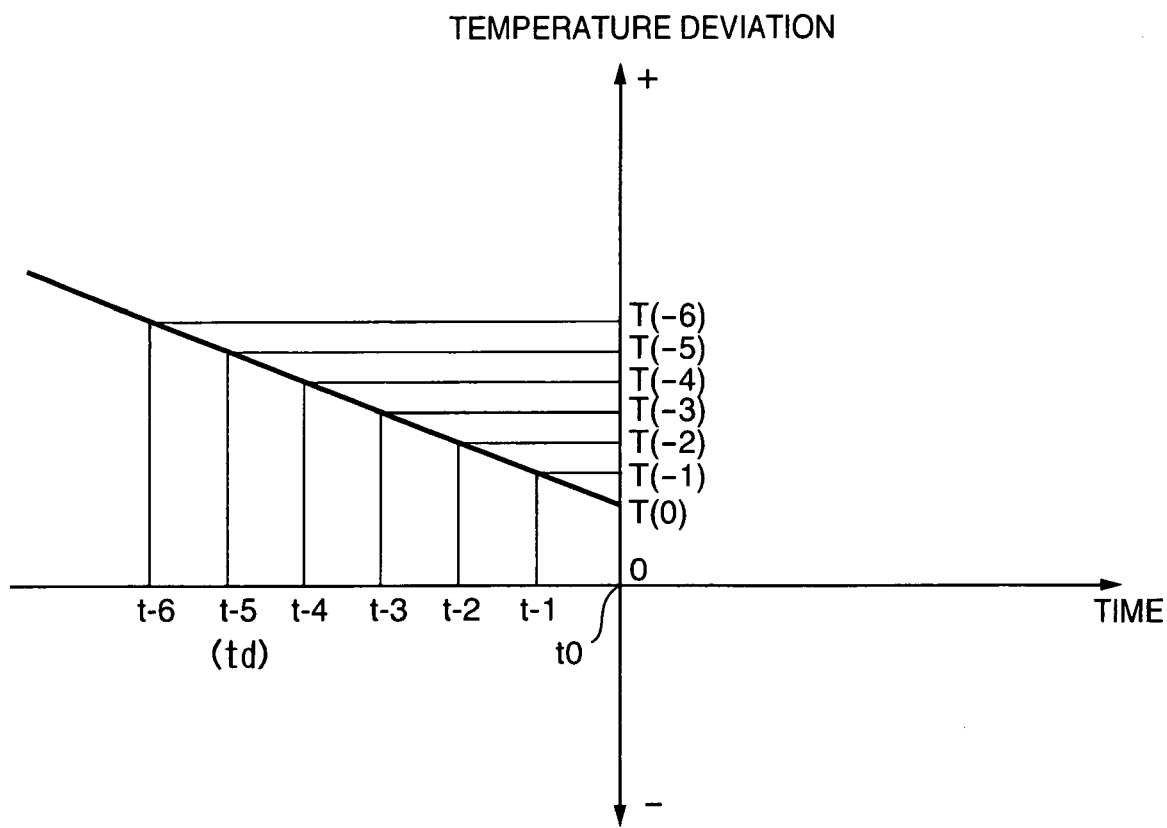
FIGS. 11A and 11B are graphs for explaining pre-activation of a PID calculator.

A concrete example of the second embodiment will be described with reference to FIG. 11A. In FIG. 11A, "$t_0$" is the switching point of time, "$t_{-6}$" to "$t_{-1}$" are points of time when the temperature deviation is sampled before the switching point of time $t_0$, "$t_n - t_{(n-1)}$" (n=−5 to 0) is a sampling rate (hereinafter referred to "$t_s$") of temperature deviation, and "$T_{(-6)}$" to "$T_{(0)}$" are the temperature deviations (e) at respective points of time.

The PID calculator 412 starts calculating the integral term ($\int e \, dt$) at the point of $t_{-5}$. In other words, the PID calculator 412 calculates an area of a trapezoid surrounded by four lines, namely a line representing $t = t_{-6}$, a line representing $t = t_{-5}$, a line representing $T = 0$, and a deviation changing line (i.e., an oblique line in FIG. 11A). In the same way, the PID calculator 412 calculates an area of a trapezoid at each point of time $t_{-4}$ to $t_{-1}$, and stores the sum of the areas of the five trapezoids calculated at the points of time $t_{-5}$ to $t_{-1}$ in the memory. The PID calculator 412 also stores $T_{(-1)}$, namely the temperature deviation at the point of time $t_{-1}$ in the memory.

At the switching point of time $t_0$, the PID calculator 412 immediately samples the temperature deviation $T_{(0)}$, and immediately calculates the manipulation amount (y) according to the above expression (1).

The proportional term (Kp·e) of the expression (1) is calculated by substituting $T_{(0)}$ for "e".

The differential term [Kd(de/dt)] of the expression (1) is calculated by using the following equation: Kd(de/dt)=Kd $(T_{(0)} - T_{(-1)})/t_s$. In order to perform this calculation, the PID calculator 412 reads out deviation $T_{(-1)}$ from the memory.

The integral term (Ki $\int e \, dt$) of the expression (1) is calculated as follows: At the switching point of time $t_0$, the PID calculator 412 immediately calculates an area of a trapezoid surrounded by four lines, namely a line representing $t = t_{-1}$, a line representing $t = t_0$, a line representing $T = 0$, and the deviation changing line. The PID calculator 412 reads out the sum of the areas of the five trapezoids from the memory, and to which adds the area calculated at the switching point of time $t_0$. Then the sum (i.e., the sum of the areas of the six trapezoids) is multiplied by "Ki".

Figure 10:
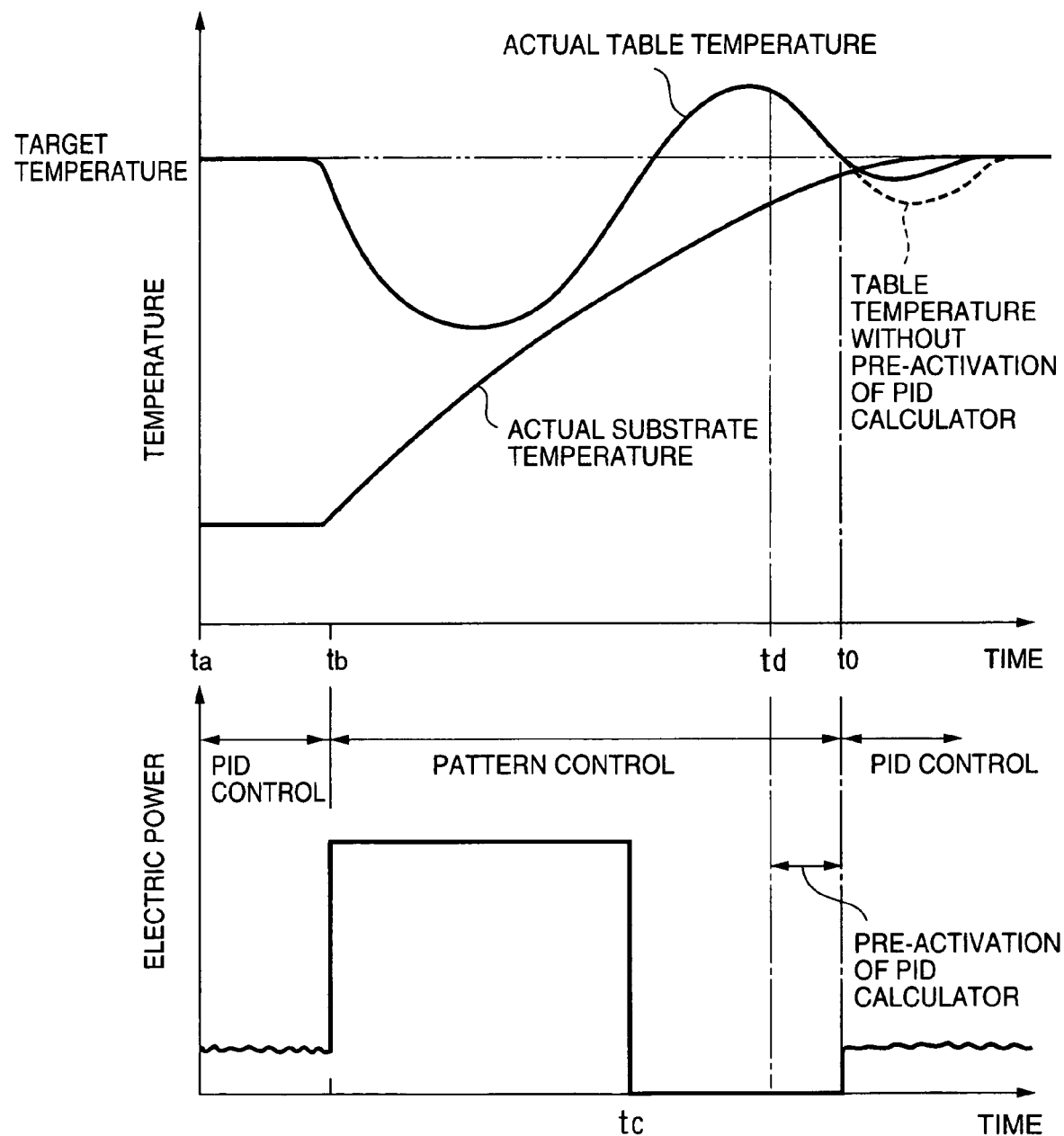
FIG. 10 is a graph showing change in actual temperature of the substrate and the substrate table, and change in electric power supplied to the heating element.

According to the second embodiment of the present invention, the manipulation amount (y) is determined at the beginning of the PID control based on the thermal history before the switching point of time. Therefore, actual temperature of the substrate table 3 and thus the actual substrate temperature become stable at the target temperature in a shorter time period, as shown in FIG. 10, in which the solid line indicates change in the actual temperature of the substrate table 3 with pre-activation of the PID calculator 412, and the chain line indicates that without pre-activation of the PID calculator 412. The pre-activation of the PID controller is specifically advantageous in a case where the switching from the pattern control mode to the PID control mode is carried out when the temperature of the substrate table 3 is being lowered due to dissipation of the heat from the substrate table 3.

The pre-activation of the PID calculator 412 is effective if the PID calculator is an analogue calculator. In this case, the PID calculator 412 is activated before the switching point of time to and performs PID calculation in a usual way.

In an alternative embodiment, the proportional term of the expression (1) may be replaced with another proportional term, which is calculated based on the average of plural values of the deviation obtained at the switching point of time to and the points of time before the switching point of time $t_0$. For Example, the proportional term may be: Kp $(T_{(-n)}+ \ldots +T_{(0)})/(n+1)$, where "n" is 5, for example.

In an alternative embodiment, the differential term [Kd (de/dt)] of the expression (1) may be calculated based on a deviation obtained before the point of time $t_{-1}$. For example, the differential term may be calculated by using the following equation: $Kd(de/dt)=Kd(T_{(0)}-T_{(-n)})/nt_s$, where "n" is 5, for example.

Figure 11B:
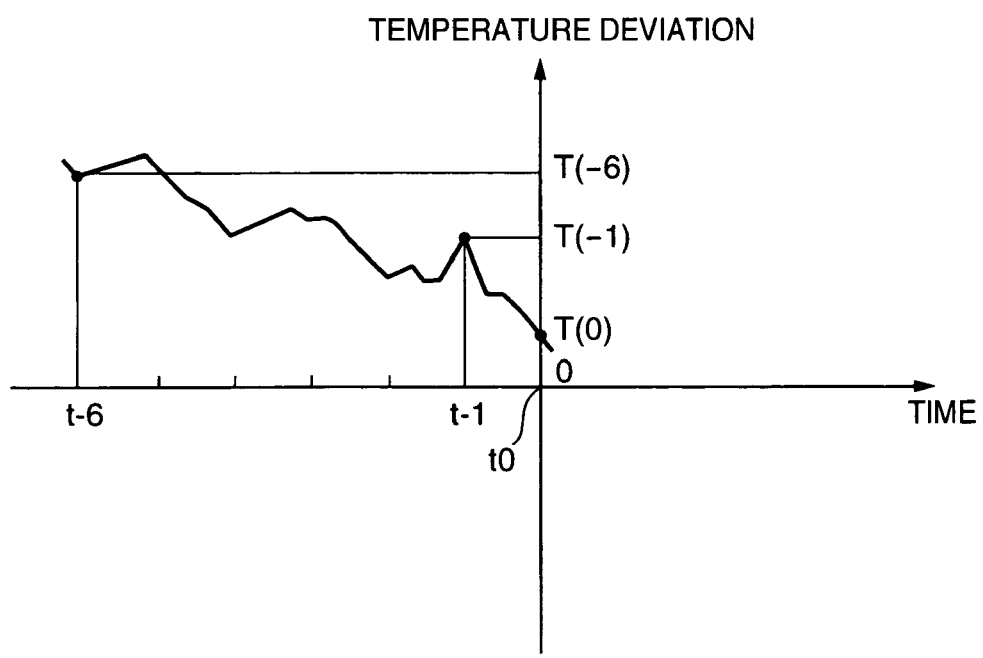
Figure 12:
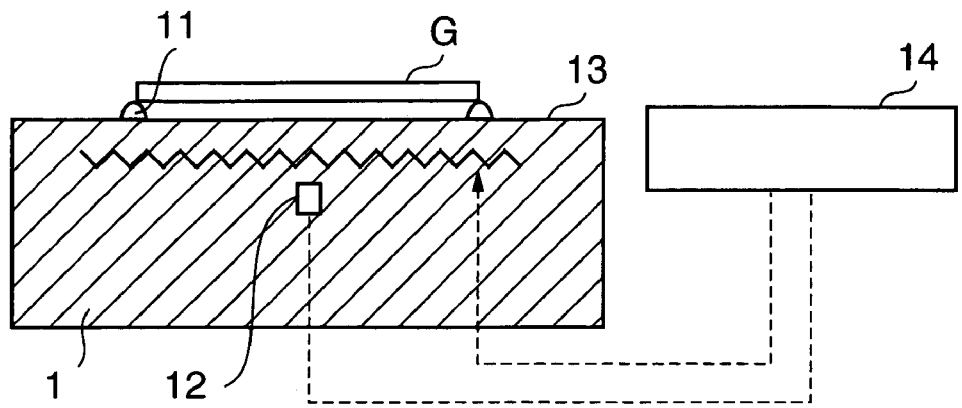
FIG. 12 is a cross-sectional view of a conventional baking apparatus.
Figure 13:
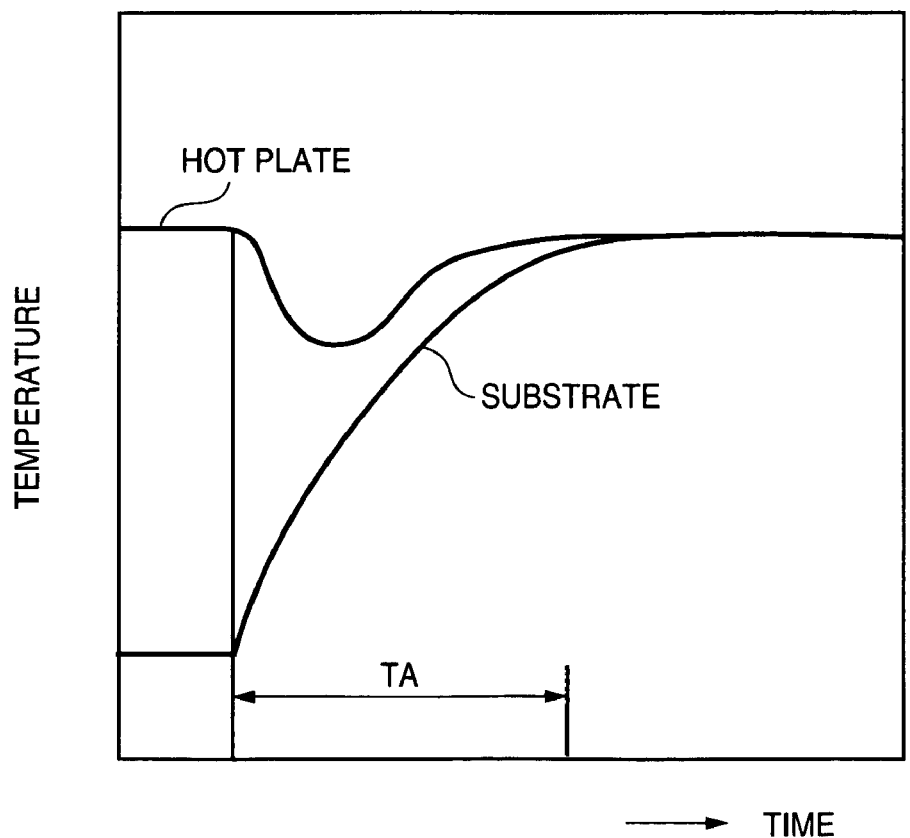
FIG. 13 is a graph showing change in actual temperature of the substrate and the substrate table in the conventional baking apparatus.

The above alternative embodiments are advantageous when noise interferes with the temperature measurement signal, as shown in FIG. 11B.

Meanwhile, it is expected that the change in actual temperature of the substrate table 3 is essentially the same for individual substrates G. If so, pre-activation of the PID calculator 412 is not necessary. In this case, the values (e.g., the sum of the areas of the five trapezoids shown in FIG. 11A, and the deviation at the point of time $t_{-1}$) necessary for calculating the manipulation amount (y) at the switching point of time to can de determined beforehand through an experiment. These values are stored in the memory of the PID calculator 412. The PID calculator 412 reads out these values from the memory and calculates the manipulation amount (y) by using these values at the switching point of time $t_0$.

The second command generator of the present invention is not limited to PID calculator, and may be means for carrying out a model control which is applied to a synthetic reaction furnace for a rubber, for example.

What is claimed is:

1. A substrate processing apparatus comprising:
   a substrate table having a heater and adapted to support a substrate to be heat treated on or above the substrate table;
   a thermometer adapted to measure temperature of the substrate table; and
   a temperature controller having first and second command generators each configured to generate at least one power command specifying electric power to be supplied the heater,
   wherein:
   the first command generator is configured to generate at least one power command specifying electric power to be supplied to the heater during a first time stage in which temperature of the substrate rises approximately to a target temperature of the substrate;
   the first command generator is configured to generate a first power command specifying electric power to be supplied to the heater during a first time period of a first time stage, and a second power command specifying electric power to be supplied to the heater during a second time period of the first time stage following the first time period of the first time stage, according to a power pattern determined beforehand to define change in electric power to be supplied to the heater during the first time stage;
   the electric power specified by the second power command is smaller than that specified by the first power command; and
   the second command generator is configured to generate a third power command specifying electric power to be supplied to the heater and determined based on a deviation of the temperature measured by the thermometer from a target temperature of the substrate table in order to make the temperature of the substrate table coincide with the target temperature of the substrate table, during a second time stage following the second time period of the first time stage.

2. The apparatus according to claim 1, wherein:
   the heater has first and second heating elements, which are respectively arranged in a first area and a second area of the substrate table and are electrically separated from each other;
   the first command generator is configured to generate the first and second powers command each specifying electric power to be supplied to the first heating element during the first time stage;
   the second command generator is configured to generate the third power command specifying electric power to be supplied to the second heating element during the second time stage.

3. The apparatus according to claim 1, wherein:
   the heater has a first heating element;
   the first command generator is configured to generate the first and second powers command each specifying electric power to be supplied to the first heating element during the first time stage;
   the second command generator is configured to generate the third power command specifying electric power to be supplied to the first heating element during the second time stage.

4. The apparatus according to claim 1, wherein the electric power specified by the second power command is zero throughout the second time period of the first time stage.

5. The apparatus according to claim 1, wherein the electric power specified by the first power command to be supplied to the heater varies during the first time period according to the power pattern.

6. The apparatus according to claim 1, wherein the first command generator is configured to start generating the first power command when the substrate is placed on or above the substrate table.

7. The apparatus according to claim 1, wherein:
   said apparatus is provided with plural sets of heating elements, thermometers and temperature controllers; and
   the power pattern assigned to the first command generator of one temperature controller is different from that assigned to the first command generator of another temperature controller.

8. The apparatus according to claim 1, wherein:
   the second command generator has a calculator configured to calculate the electric power corresponding to the third power command;
   the calculator is also configured to calculate or store, during the second time period of the first time stage, a value necessary for the calculator to calculate the electric power corresponding to the third power command at a beginning of the second time stage; and
   the temperature controller has an activator configured to activate the calculator before the second time period has elapsed.

9. The apparatus according to claim 1, wherein:
   the second command generator has a calculator configured to calculate the electric power corresponding to the third power command;
   the calculator has a memory that stores a value, which is determined beforehand and is necessary for the calculator to calculate the electric power corresponding to the third power command at a beginning of the second time stage.

10. A substrate processing apparatus comprising:
a substrate table having a heater and adapted to support a substrate to be heat treated on or above the substrate table;
a thermometer adapted to measure temperature of the substrate table; and
a temperature controller having a first command generator and a second command generator, the first command generator being configured to generate a first power command specifying electric power to be supplied to the heater during a first time stage, the second command generator being configured to generate a second power command specifying electric power to be supplied to the heater and determined based on a deviation of the temperature measured by the thermometer from a target temperature of the substrate table in order to make the temperature of the substrate table coincide with the target temperature of the substrate table, during a second time stage following the first time stage,
wherein:
the second command generator has a calculator configured to calculate the electric power corresponding to the second power command;
the calculator is also configured to calculate or store, during the first time stage, a value necessary for the calculator to calculate the electric power corresponding to the second power command at a beginning of the second time stage; and
the temperature controller has an activator configured to activate the calculator before the first time stage has completed.

11. A substrate processing apparatus comprising:
a substrate table having a heater and adapted to support a substrate to be heat treated on or above the substrate table;
a thermometer adapted to measure temperature of the substrate table; and
a temperature controller having a first command generator and a second command generator, the first command generator being configured to generate a first power command specifying electric power to be supplied to the heater during a first time stage, the second command generator being configured to generate a second power command specifying electric power to be supplied to the heater and determined based on a deviation of the temperature measured by the thermometer from a target temperature of the substrate table in order to make the temperature of the substrate table coincide with the target temperature of the substrate table, during a second time stage following the first time stage,
wherein:
the second command generator has a calculator configured to calculate the electric power corresponding to the second power command;
the calculator has a memory that stores a value, which is determined beforehand and is necessary for the calculator to calculate the electric power corresponding to the third power command at a beginning of the second time stage.

12. A substrate processing method comprising the steps of:
placing a substrate on or above a substrate table having a heater;
supplying a first electric power, which is determined beforehand, to the heater for a first time period, and thereafter supplying a second electric power, which is determined beforehand and is smaller than the first electric power, to the heater for a second time period, thereby raising temperature of the substrate table to overshoot a target temperature of the substrate table and thereafter lowering the temperature of the substrate table approximately to the target temperature of the substrate, and thereby raising temperature of the substrate approximately to a target temperature of the substrate;
supplying, after supplying the second electric power to the heater for the second time period, a third electric power to the heater for a third time period, while measuring temperature of the substrate table and while controlling the third electric power based on a deviation of the measured temperature of the substrate table from the target temperature of the substrate table in order to make the measured temperature of the substrate table coincide with the target temperature of the substrate table.

13. The method according to claim 12, wherein:
the heater has first and second heating elements, which are respectively arranged in a first area and a second area of the substrate table and are electrically separated from each other;
the first and second electric power is supplied to the first heating element, and the third electric power is supplied to the second heating element.

14. The method according to claim 12, wherein:
the heater has a first heating element; and
the first, second and third electric power is supplied to the first heating element.

15. The method according to claim 12, wherein the second electric power is kept at zero throughout the second time period.

16. The method according to claim 12, wherein the step of supplying first electric power starts when the substrate is placed on or above the substrate table.

17. The method according to claim 12, wherein transition from the step of supplying the second electric power to the step of supplying the third electric power is carried out when a measured temperature of the substrate table reaches a predetermined temperature, and thus the second time period varies depending on the measured temperature of the substrate table.

18. The method according to claim 12, wherein transition from the step of supplying the second electric power to the step of supplying the third electric power is carried out when a predetermined time has elapsed from a point of time when the substrate is placed on or above the substrate table, and thus the first and second time periods are fixed.

19. The method according to claim 12, wherein the first electric power varies during the first time period.

20. The method according to claim 12, wherein a calculation of a value necessary to determine the third electric power starts in the second time period.

21. The method according to claim 20, wherein the third electric power is determined by using a mathematical expression including an integral term which represents time integral of the deviation, said method further comprising the steps of:
measuring the temperature of the substrate table and calculating the deviation, before the step of supplying the third electric power;
calculating the time integral of the deviation before the step of supplying the third electric power; and determining the third electric power at a beginning of the third time period by applying the calculated time integral to the mathematical equation.

22. The method according to claim 12, wherein:

the third electric power is determined by using a mathematical expression including an integral term which represents time integral of the deviation; and the third electric power is determined at a beginning of the third time period by using an expected value of the time integral of the deviation during the second time period which is determined beforehand through an experiment.

23. The method according to claim 12, wherein:

the heater includes at least two heating elements, which are provided for heating different areas of the substrate table, respectively; and in the step of supplying the first electric power and the second electric power, at least one of the first electric power, the second electric power, the first time period or the second time period relating to one heating element is different from that relating to another heating element.

* * * * *